(12) United States Patent
Schmid

(10) Patent No.: US 7,619,487 B2
(45) Date of Patent: Nov. 17, 2009

(54) POLAR MODULATION WITHOUT ANALOG FILTERING

(75) Inventor: Andreas Schmid, Duisburg (DE)

(73) Assignee: Infineon Technologies AG, Neubiberg (DE)

( * ) Notice: Subject to any disclaimer, the term of this patent is extended or adjusted under 35 U.S.C. 154(b) by 173 days.

(21) Appl. No.: 11/855,782

(22) Filed: Sep. 14, 2007

(65) Prior Publication Data

US 2009/0072921 A1    Mar. 19, 2009

(51) Int. Cl.
*H03C 3/38* (2006.01)

(52) U.S. Cl. ............... 332/145; 332/152; 375/302; 455/102

(58) Field of Classification Search ........... 332/145, 332/152; 455/102; 375/302
See application file for complete search history.

(56) References Cited

U.S. PATENT DOCUMENTS

| 7,447,272 | B2* | 11/2008 | Haglan | 375/295 |
| 7,522,658 | B2* | 4/2009 | Jensen | 375/219 |
| 2008/0064343 | A1* | 3/2008 | Lewis | 455/91 |

* cited by examiner

*Primary Examiner*—Robert Pascal
*Assistant Examiner*—James E Goodley
(74) *Attorney, Agent, or Firm*—Lee & Hayes, PLLC

(57) ABSTRACT

This disclosure relates to systems and methods for polar modulation without analog filters. Digitals filters, a second order hold interpolator and a reconfigurable third order noise shaper can be used instead of the analog filters used in conventional polar modulators. The polar modulator receives either receives the input in polar coordinates or converts the signal into polar phase and amplitude components. The phase and amplitude components are processed separately using digital signal processing components including digital filters, PLL, interpolator and noise shaper. The processed phase and amplitude components are then mixed to generate the modulated signal.

21 Claims, 10 Drawing Sheets

POLAR MODULATION WITHOUT ANALOG FILTERING

BACKGROUND

Wireless communication has been a major area of research in recent years. Worldwide proliferation of wireless devices, such as mobile phones has led to emergence of several new technologies in this domain. Modulation of signals for wireless communication is one such area where new technologies and improvements over existing techniques are coming up at a rapid pace.

FIG. 1 is a block diagram illustrating a known polar modulator. Modern communication systems, such as the Universal Mobile Telecommunications System (UMTS) make use of polar modulation for modulating the baseband signals. An existing technique for implementing polar modulation is shown in FIG. 1.

In-phase (I) and quadrature (Q) baseband signals are applied to a COordinate Rotation DIgital Computer (CORDIC) 102, which converts the baseband signals into corresponding polar components: an amplitude signal 104 and a phase signal 106.

The amplitude signal 104 is passed through a Digital to Analog Converter (DAC) 108 that converts the digital amplitude signal 104 into a corresponding analog signal. The analog signal is then passed through an analog filter 110, which removes the signal components that are beyond a certain frequency offset from the analog signal. The phase signal 106 is passed through a Phase Locked Loop (PLL) 112, which maintains constant phase of the input signal. The output from the analog filter 110 and the output from the Phase Locked Loop 112 are combined together at a mixer 114, and are sent to an amplifier 116 for amplification. The amplified signal is then sent to a power amplifier 118 to ensure power efficiency. Thereafter the signal is transmitted via an antenna 120.

The polar modulator described above is generally implemented using silicon chip technology. The analog filters that are employed in polar modulators do not shrink as well as the digital components when the silicon structures achieve miniaturization. Furthermore, each of the analog filters fabricated on the chip have to be matched to each other. In other words, each of the filters would need to have the same gain in order to avoid differential non-linearity. Achieving this can be difficult in semiconductor implementation.

SUMMARY

This summary is provided to introduce concepts relating to a polar modulation technique without analog filtering. These concepts are further described below in detailed description. The presented summary is not intended to identify essential features of the claimed subject matter, nor is it intended for use in determining the scope of the claimed subject matter.

In an embodiment, polar modulation is performed on a baseband signal. The baseband signal is converted from rectangular coordinate signal to polar amplitude and phase signals. Digital filtering is performed on the polar amplitude and phase signals. The amplitude signal is converted to an analog signal and combined with the phase signal.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

Figure 1:
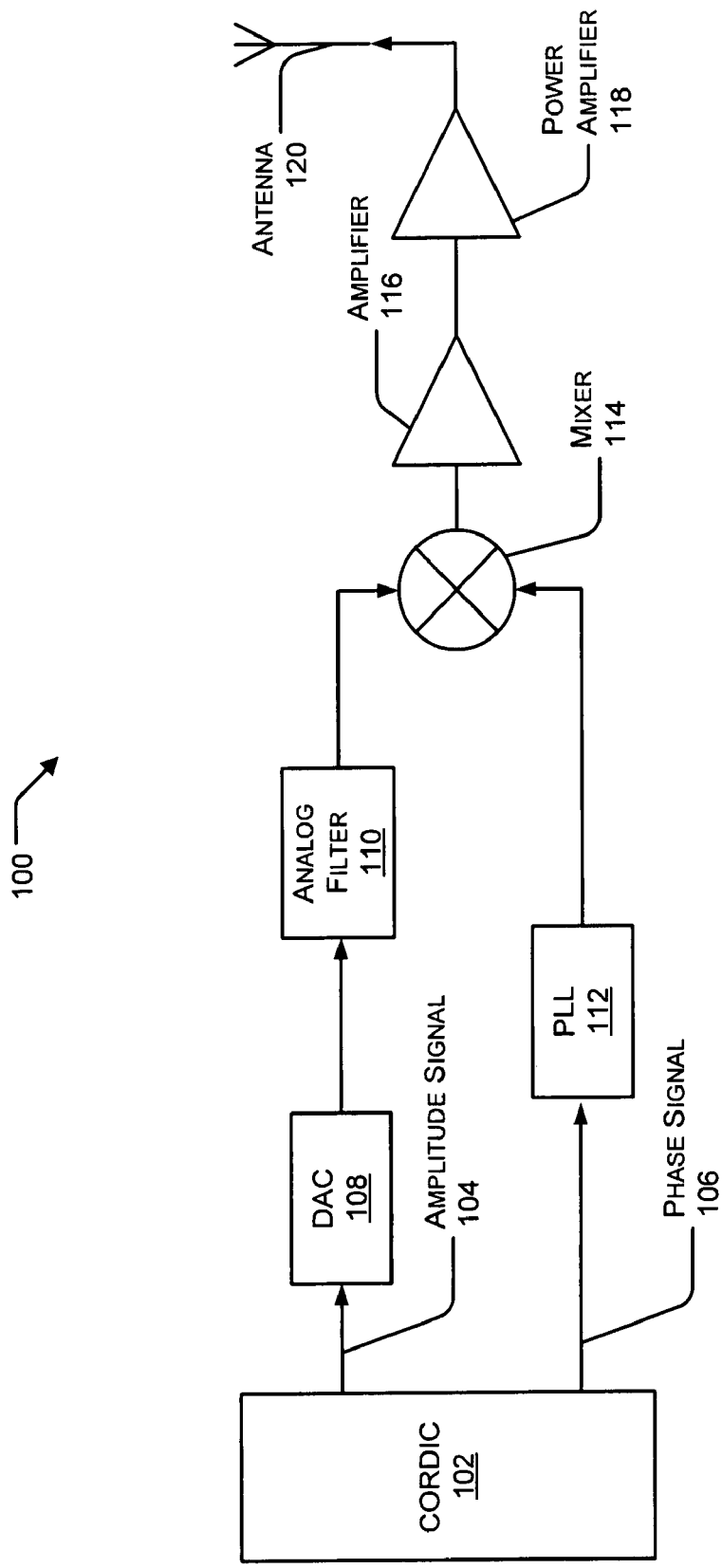
FIG. 1 is a block diagram illustrating a known polar modulator using analog filters.

This disclosure is directed to techniques for polar modulation without analog filtering. More particularly, the techniques involve implementation of a digital polar modulator that does not include analog filters. The disclosed digital polar modulator can be implemented in a variety of communication systems. For example, polar modulators can be implemented in wireless communication devices, mobile communication devices, and so on. The following systems and methods are described with reference to a mobile communication device; however, it will be appreciated that the disclosed digital polar modulator can be used in any of the various other devices and systems, e.g. in wireline or optical communication systems.

Many factors may be considered while selecting a modulation technique for modulating signals in wireless communication. Such factors may include the type of technology used, the type of signal to be transmitted, bandwidth availability, etc. Generally, it is preferred to use a modulation technique that offers maximum reliability and efficiency at reasonable implementation (i.e., manufacturing) costs.

In modern mobile communication systems, such as 3G mobile technology, polar modulation can provide considerable advantages over other modulation techniques. Since a polar modulator is generally implemented using semiconductor chip technology, it is desirable to minimize the use of analog components in the polar modulator, because analog components are typically larger than their digital counterparts. The disclosed digital polar modulator avoids use of analog filters and thus provides considerable reduction in chip size, which yields substantial cost reductions in production.

The digital polar modulator employs digital components in place of analog filters. The use of digital components helps in better silicon implementation and does not require matched gain for different components. In an embodiment, the digital components that replace analog filters, as used in conventional polar modulators, include a digital filter, an interpolator and a noise shaper.

In an implementation, the digital polar modulator first converts incoming baseband (I and Q) signals into polar amplitude and phase signals. The amplitude and phase signals are processed separately and then mixed to generate a modulated output signal. The phase signal passes through one or more digital filters that band limit the signal. Next, a differentiator converts the phase signal into a corresponding frequency signal that in turn passes through a PLL. The PLL typically generates stable frequencies and recovers signals from noisy communication channels. The resulting signal from the PLL is then fed to a mixer.

The amplitude signal also passes through one or more digital filters that limit the bandwidth of the signal. Then, the amplitude signal passes through an interpolator, which increases the sample rate the amplitude signal, thereby increasing its accuracy. Next, a noise shaper shapes the quantization noise present in the amplitude signal to a part of the spectrum where it does not violate any spectral requirements. Thereafter, the amplitude signal passes through a DAC, which converts the digital amplitude signal to a corresponding analog amplitude signal. The analog amplitude signal is then fed to the mixer.

At the mixer, the phase signal and the amplitude signals as processed above are both combined together to produce the modulated signal. This signal is sent to a duplexer, then to a power amplifier and then transmitted via the antenna.

Figure 2:
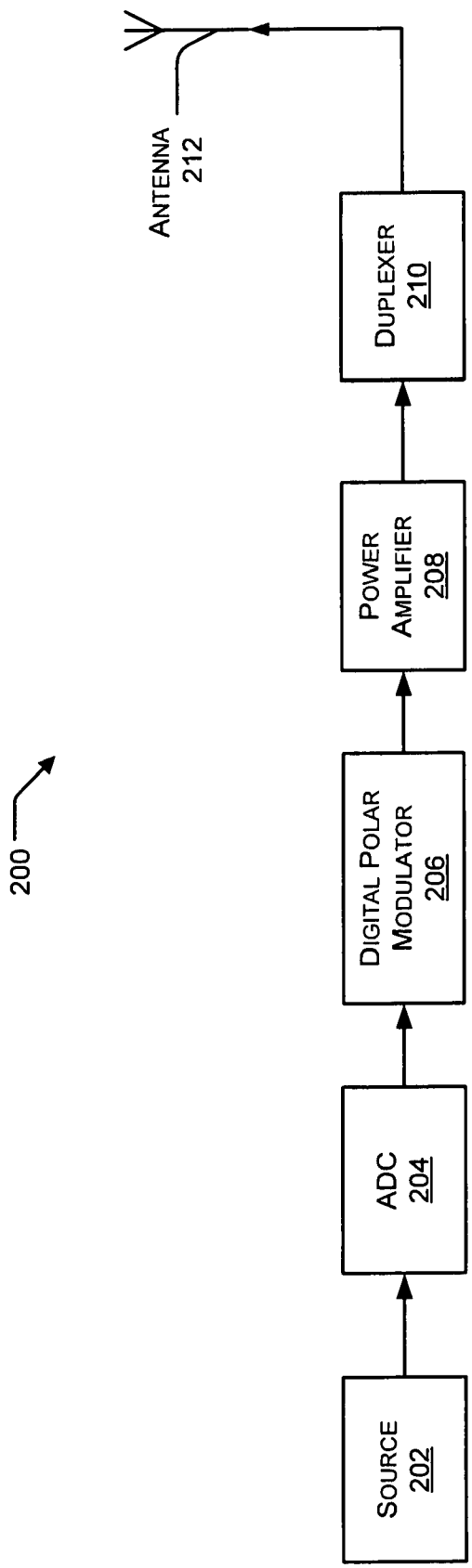
FIG. 2 is a block diagram illustrating an exemplary system for implementing polar modulation without analog filtering.

FIG. 2 illustrates an exemplary system employing a digital polar modulator. It is to be appreciated that the order in which this block diagram and other block diagrams that described is not intended to be construed as a limitation, and any number of the described system blocks can be combined in any order to implement the system, or an alternate system. Additionally, individual blocks may be deleted from the system without departing from the spirit and scope of the subject matter described herein. Furthermore, the system can be implemented in any suitable hardware, software, firmware, or a combination thereof, without departing from the scope of the invention.

The block diagram 200 includes a source 202, an ADC (analog to digital converter) 204, and a digital polar modulator 206. The output from the digital polar modulator 206 drives a power amplifier 208. The output signal from the power amplifier 208 passes through a duplexer 210, and is then transmitted via the antenna 212.

The output from the source 202 received by the ADC 204 can be in the form of voice signals or data signals or a combination of the two. In case of a voice signal, the source 202 can be a microphone, and the source signal would be analog. If the signal were a data signal, then the source signal could be in digital form.

In an implementation, the ADC 204 converts the source signal to a digital signal. If the source signal is already in digital format, the ADC 204 can be omitted. The ADC 204 can include various signal processing components, such as a sampler, a quantizer and a code modulation system block. The sampling rate of the signal depends on the frequency of the source signal. Therefore, in an implementation, the source signal can be band limited initially using a low pass filter before the analog to digital conversion.

The digital polar modulator (or polar modulator) 206 receives the digital signal either from the source 202 or from the ADC 204, and modulates the digital baseband signal. Towards this end, the polar modulator 206 first converts the digital baseband signal into polar amplitude and phase signals, which are then modulated. The polar modulator 206 is described further in detail below with reference to FIGS. 3-9.

The power amplifier 208 amplifies and increases the power efficiency of the modulated signal received from the polar modulator 206. In an implementation, such as in a mobile communication system, the power amplifier 208 can be a class C or D non-linear amplifier working in the saturated mode close to the cut-off. In this mode, the non-linear amplifier is usually the most efficient and uses less mobile station battery (i.e., power).

The amplified signal from the power amplifier 208 is passed through the duplexer 210, which allows the signal to be transmitted via the antenna 212. The duplexer 210 is a device that isolates transmitter signals from receiver signals while allowing a transmitter and a receiver to share the same antenna 212 for transmitting and receiving signals respectively. For this, the duplexer 210 isolates the transmitted signal so that the received signal does not interfere with the transmitter signal and vice versa.

Figure 3:
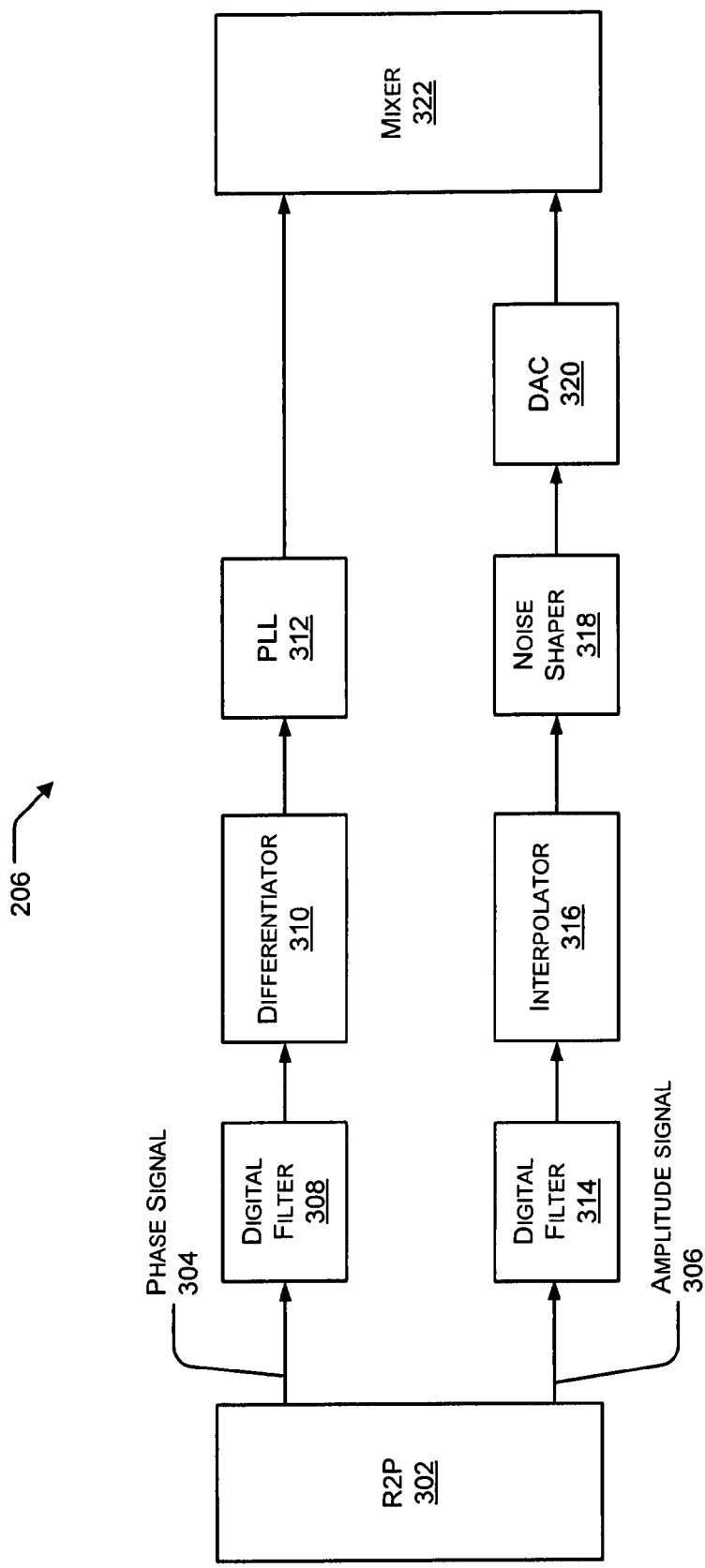
FIG. 3 is a block diagram illustrating an exemplary polar modulator for implementing polar modulation without analog filtering.

FIG. 3 illustrates an exemplary digital polar modulator or polar modulator 206 to implement digital polar modulation without the use of analog filters. To this end, the polar modulator 206 includes a rectangular to polar coordinates (R2P) converter 302.

The R2P converter 302 converts the in-phase and quadrature components of a received digital baseband signal into a phase signal 304 and an amplitude signal 306 to be applied in polar modulation. Though the received baseband signals may be band limited, but after the conversion from in-phase (I) and quadrature (Q) to the phase signal 304 and the amplitude signal 306 they generally do not remain band limited. Therefore, both the phase signal 304 and the amplitude signal 306 may need to be band limited initially using digital filters.

Digital filters typically have a number of advantages over their counterpart analog filters. The digital filters can be more accurate as compared to analog filters and can provide very precise cut-off points. In addition, the digital filters can provide better signal to noise ratios than analog filters. Furthermore, digital filters can be smaller as compared to analog filters, which can enable smaller chip sizes to be built and can reduce the production cost as well.

Along with digital filters, other digital signal processing components may also used in the polar modulator 206 to process the phase signal 304 and the amplitude signal 306. In an implementation, the phase signal 304 is processed using one or more digital filter(s) 308, a digital differentiator 310 and a PLL (phase locked loop) 312. The amplitude signal 306 is processed using one or more digital filter(s) 314, an interpolator 316, a noise shaper 318 and is converted to analog using a digital to analog converter (DAC) 320. Thereafter, the processed amplitude signal can be combined with the processed phase signal in a modulator 322 to produce a modulated signal. The modulated signal can be sent to the transmitting antenna 212.

In an implementation, the phase signal 304 remains digital throughout the polar modulation process. In another implementation, the phase signal 304 can be converted into an analog signal before it reaches the modulator 322. Initially, the phase signal 304 is passed through one or more digital filter(s) 308. The digital filter 308 can be a low pass filter that band limits the input phase signal 304. For example, the digital filter 308 can remove high frequency noise from the phase signal 304. The high frequency noise may be the quantization noise introduced when the analog signal is converted into a digital signal, due to the finite resolution of the digital representation of the analog signal.

Once the phase signal 304 is band limited, the phase signal 304 passes through a differentiator 310. The differentiator 310 generates an output signal that is proportional to the rate of change of the input signal. Since the rate of change of the phase is equal to the frequency, the differentiator 310 differentiates the phase signal 304 into a frequency signal that is proportional to the phase signal 304.

The PLL 312 receives the frequency signal from the differentiator 310 as an input. A PLL or phase locked loop typically generates stable frequencies and recovers signals from noisy communication channels. Therefore, the PLL 312 generates a signal of stable frequency that is locked to the phase of the input signal. In an implementation, the PLL 312 can be replaced by a circuit that executes an integration function (i.e. an integrator) followed by a circuit that executes an exponential function. This set-up can provide functionality similar to that provided by the PLL 312. The stable frequency signal generated by the PLL 312 is then sent to the modulator 322 that combines the processed phase signal and the processed amplitude signal to obtain a modulated signal.

The amplitude signal 306 that is one of the outputs of the R2P converter 302 is also passed through one or more digital filter(s) 314. The digital filter(s) 314 band limits the amplitude signal 306. The digital filter(s) 314 can be a low pass filter that attenuates the high frequency signals. It will be appreciated that any suitable digital filter can be utilized in the disclosed digital polar modulation technique, that efficiently band limits the amplitude signal 306.

In processing the amplitude signal 306, the use of analog filters is avoided by use of high oversampling rates, high order interpolation, and adaptive noise shaping as described in an exemplary implementation below. The output of the digital filter(s) 314 can be fed to an interpolator 316. The interpolator 316 increases the sampling rate of a signal by increasing the number of samples. The interpolator 316 improves the accuracy of the signal by increasing the number of samples, which in turn provides a better representation of the analog signal. In one implementation, the interpolator 316 can include a low pass filter. It will be appreciated that any suitable interpolator 316 can be used for up-sampling. For example, a second order hold interpolator can be used to suppress the repetition spectrum from the lower sample rate domain.

A second order hold interpolator is a quadratic interpolator that uses polynomial function for interpolation. Quadratic interpolators can be more precise than linear interpolators. Since quadratic interpolators use polynomial functions, quadratic interpolators can be differentiated better. For example, the input signal to the interpolator 316 can be a 100 MHz amplitude signal 306 and the output obtained at the end of the interpolation can be a 900 MHz amplitude signal. This implies an up-sampling factor of nine and the sampling rate increases nine times over. As the sampling rate increases, the bit length can be decreased accordingly. An exemplary second order hold interpolator is described in detail in FIG. 5.

Once the amplitude signal 306 is up-sampled, the amplitude signal 306 passes through a noise shaper 318. The noise shaper 318 is adaptive as described below. In an implementation, the noise shaper 318 can be a reconfigurable third order noise shaper. Noise shaping is a bit reduction technique used to minimize quantization error. For example, the input digital signal to the noise shaper 318 can be of 16-bit resolution and the digital signal obtained at the output of the noise shaper 318 can be of 10-12 bit resolution. The noise shaper 318 reshapes the frequency contour of the noise to some part of the spectrum where it does not violate the emission mask for the respective communication standard. For example, the noise shaper 318 can shape quantization noise by shifting the quantization noise to frequencies other than the current duplex frequencies. The noise shaper 318 may also utilize a low pass filter to reduce the quantization noise and improve the quality of the signal by improving the signal to noise ratio of the signal.

In an implementation, a third order noise shaper can be used. As compared to a lower order noise shaper, a third order noise shaper can provide much better noise reduction and can improve the signal to noise ratio more than a lower order noise shaper. In addition, a lower order noise shaper can be insufficient to meet the duplex requirements of the UMTS bands at 45 MHz, 80 MHz, 95 MHz, 190 MHz and 400 MHZ. The third order noise shaper allows a notch at DC to improve the Error Vector Magnitude (EVM) and a notch at the current duplex frequency to shape the quantization noise around the duplex requirement. In other mobile and wireless communication systems, other orders of noise shapers can be used. An exemplary third order noise shaper is further discussed in detail below, in FIG. 6.

The improved amplitude signal obtained from the noise shaper 318 can be converted into an analog signal before being combined with the phase signal 304. In an implementation, a 10-12 bit DAC 320 can be used. It will be appreciated, that any DAC 320 can be used in the digital polar modulator 206. For example, a fully segmented DAC can be used. A fully segmented DAC is one of the fastest DACs available and it can provide high precision. Typically, while using analog filters, binary weighted DACs can be used instead of fully segmented DACs. An analog filter could then be placed on each bit line before the DAC. However, as the number of bits increases, the analog filters become more and more difficult to match, effectively limiting the bit resolution. Using digital filtering can allow the use of a fully segmented DAC, which can further improve the modulated signal.

Once both the phase signal 304 and the amplitude signal 306 are processed as described above, the processed signals are combined at the modulator 322. In an embodiment, the amplitude signal 306 is converted into analog while the phase signal 304 remains digital. In another embodiment, the phase signal 304 can be converted into analog as well. The output of the modulator 322 is the modulated signal. This signal can be sent to the power amplifier 208, followed by the duplexer 210 and then transmitted via the antenna 212, as described earlier.

Figure 4:
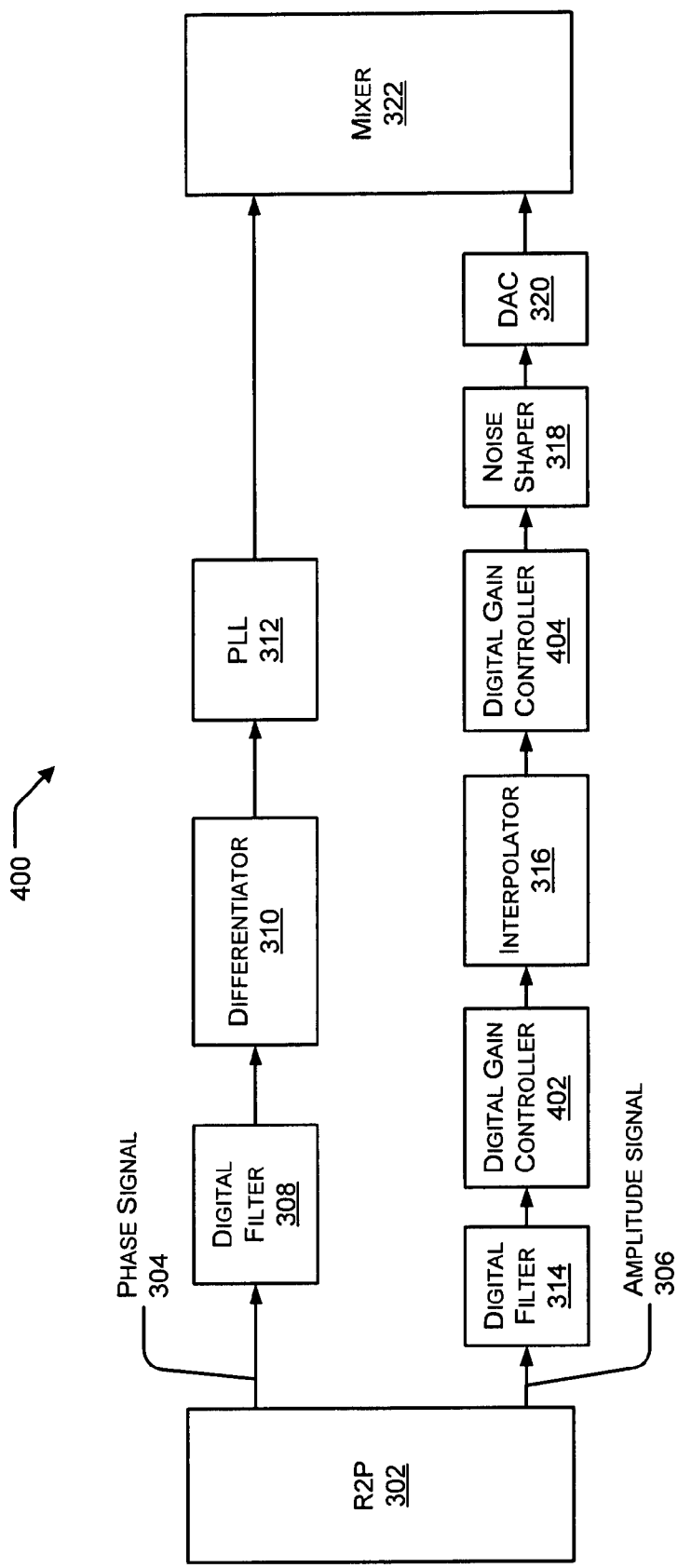
FIG. 4 is a block diagram illustrating an exemplary polar modulator with digital gain control for implementing polar modulation without analog filtering.

FIG. 4 illustrates an exemplary digital polar modulator 400 with digital gain control. The use of digital gain control in the polar modulation architecture can further improve the signal quality, increase the dynamic range of the signal, and improve the signal to noise ratio of the signal.

In an implementation, digital gain control can be incorporated into the amplitude signal 306 path before the noise shaper 318. As shown in FIG. 4, the digital gain control blocks 402 and 404 can be placed either before or after the interpolator 316.

In another embodiment, the digital gain control can be distributed before and after the interpolator 316. If a high gain is introduced before the interpolator 316, it can increase the bit width of the signal. In such a case, the digital gain controller 402 may be used to cover a small range (from 0-6 dB). Since the digital gain controller 402 increases the output power by 6 dB, the bit width is increased by one bit. Thus, although the digital gain controller 402 doubles the power, it still keeps the bit resolution as low as possible. This way, the fine-grained digital gain controller 402 is limited to a range of 6 dB increments, which allows the use of a substantially lower bit width for the interpolator 316.

In an implementation, the digital gain controller 404 can be incremented in steps of 6 dB. Although this location after the interpolator is the high sample rate domain, the power consumption can be kept low since the step size of 6 dB corresponds to simply shifting the digital word by one bit. For example, if a 6 dB gain is required, the signal is shifted by 1 bit, which multiplies the amplitude signal 306 by a factor of two and increases the output power by 6 dB.

Figure 5:
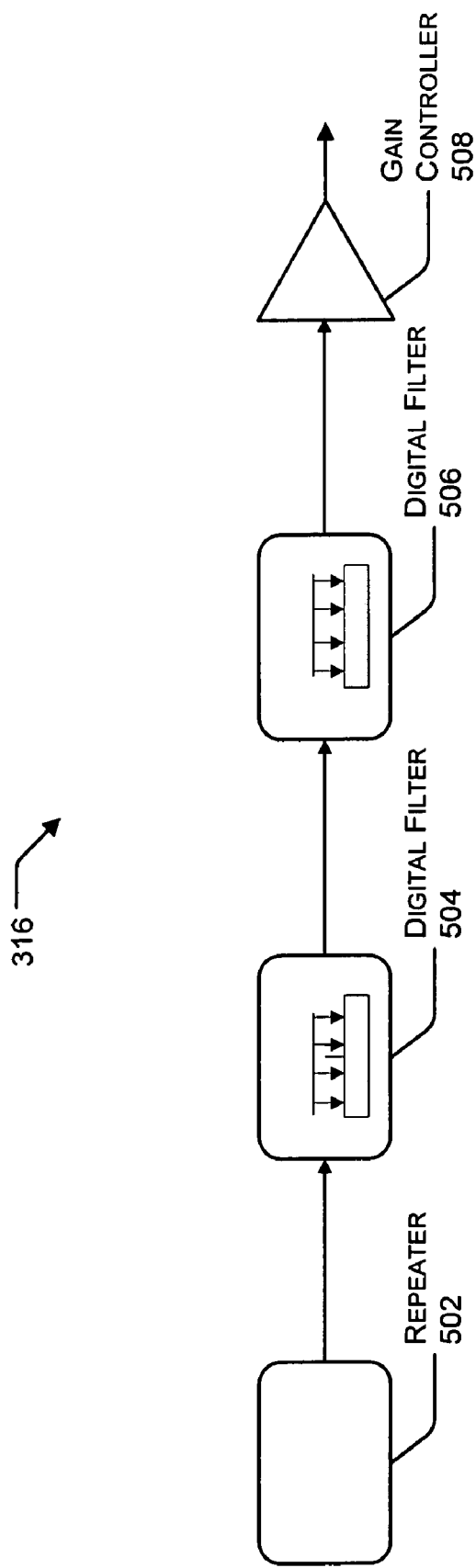
FIG. 5 is a block diagram illustrating an exemplary second order hold interpolator.

FIG. 5 illustrates an exemplary behavior model of the second order hold interpolator 316. It should be noted that the filters used in this design merely suggest one implementation of the second order interpolator and any other type of digital filters can be used in this design. For example, instead of using the finite impulse response (FIR) filters, a cascaded integrator-comb (CIC) filter can also be used.

Second order interpolation refers to quadratic interpolation or polynomial interpolation with the order of the polynomial being two. The order of a digital filter can be determined by calculating the number of previous inputs required to calculate the current output. Therefore, in second order interpolation previous two inputs are used to calculate the current output.

As shown in FIG. 5, an input signal is first fed to a repeater 502. The repeater block 502 represents zero order interpolation. In a zero order interpolator, no previous inputs are required to calculate the current output and the current output depends only on the current input. This type of interpolation assigns the same value as the previous sample, i.e. the output is the same as the input. This is also referred to as a sample and hold circuit. For example, when a signal is up-sampled to 900 MHz from 100 MHz, the up-sampling factor is 9, and the bit length becomes ⅑th the original value. In such a case, the repeater 502 outputs 9 output samples for every input sample.

The output from the repeater 502 is fed to a digital filter 504. In one implementation, this is a finite impulse response filter (FIR). In yet another implementation the digital filter 504 can be a CIC filter. The digital filter 504 can have unit gain and it can act as a first order interpolator or a linear interpolator. Linear interpolation is carried out by introducing a sample at the mid point between two samples. The output of the first order interpolator depends on one previous input as well as the current input. The FIR filter in this implementation has nine taps, each with unit gain. Therefore, the sampling rate at the output is 9 times the sampling rate at the input.

The output from the digital filter 504 can be fed to another digital filter 506 of unit gain. In one implementation, an FIR filter can be used to implement a quadratic or second order interpolation. As mentioned, quadratic interpolators use a second order polynomial function instead of a linear function for interpolation. For example, the FIR filter 506 has nine taps each with unit gain, so the output of this block is also nine samples for every input sample.

The output after block 506 is the up-sampled amplitude signal. For example, in the implementation described above, the sampling frequency achieved after the second digital filter 506 is 900 MHz. It should be noted that by changing the number of taps in the FIR filter any sampling rate could be achieved as long as it meets the Nyquist rate requirements.

The up-sampled signal is sent to a gain controller 508. The gain introduced by the digital filters is compensated here. In this implementation, the gain control block introduces a gain of ⅟₈₁ to compensate the gain introduced by the two FIR filters; however, a repetition spectrum can arise at the multiple of the sampling frequency during sampling. Typically, a second order hold interpolator, such as the second order hold interpolator 316, can also suppress such repetition spectra better than a lower order interpolator.

Figure 6:
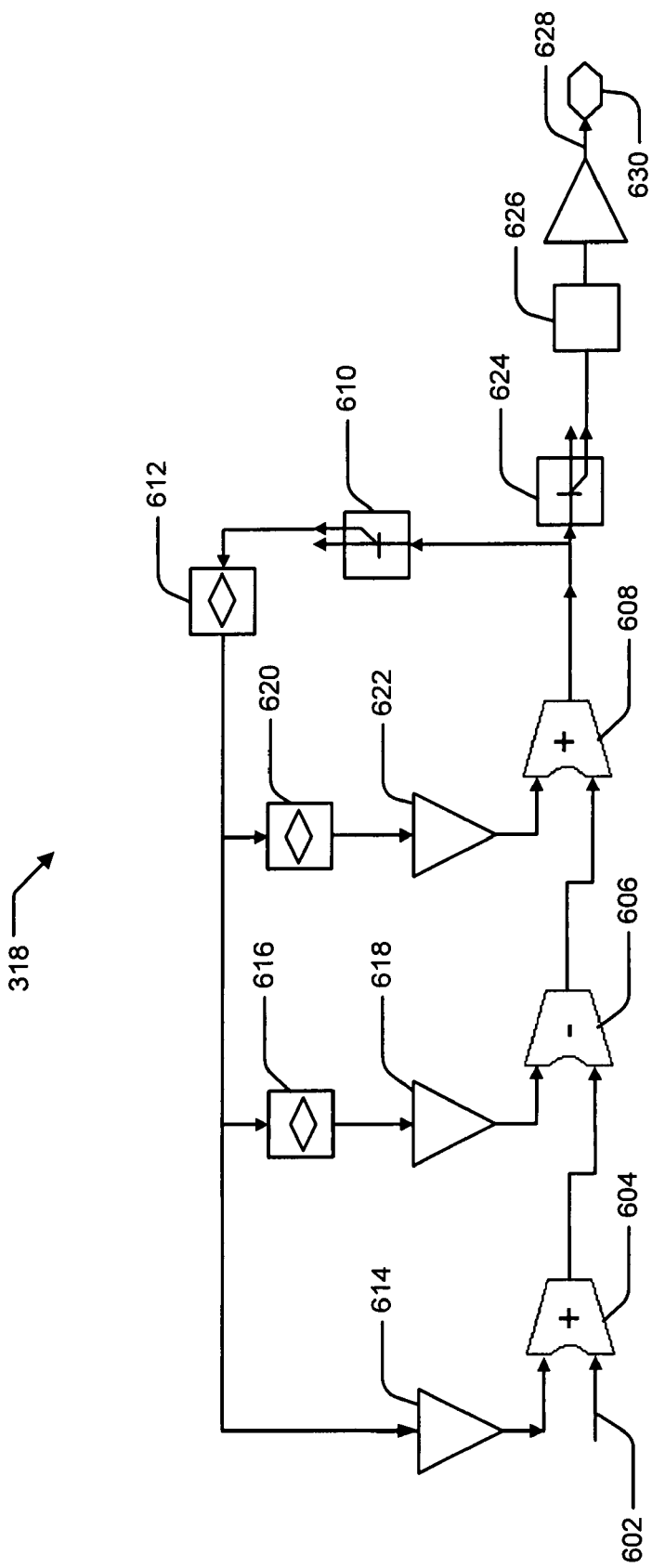
FIG. 6 is a block diagram illustrating an exemplary reconfigurable third order noise shaper.

FIG. 6 illustrates an exemplary behavior model of a third order reconfigurable noise shaper 318 for implementing polar modulation. It is to be noted that an input 602 signal could be of any bit length. For example, in this model, the bit length is 16 bits. The signal is then processed in 3 feedback stages with different gain factors at each stage, for third order noise shaping. Adders/subtractors 604, 606 and 608 add or subtract the feedback signal according to the gain factors used.

For example, in a UMTS communication system, reconfigurable gain factors of (+2, −2, +1) and (+1, +1, −1) may be used. UMTS mobile phones and base stations typically have a duplexer that isolates the transmitter and receiver while permitting them to share a common antenna. For example, the duplex frequencies in UMTS are 45 MHz, 80 MHz, 95 MHz, 190 MHz and 400 MHz. in the UMTS band I the uplink frequency band is 1920-1980 MHz while the downlink frequency band is 2110-2170 MHz. Therefore, the difference between the receiver and transmitter frequencies is 190 MHz. The polar modulator in UMTS for band I, suppresses and attenuates the receiver frequency so that it does not cause distortion and cross talk in the transmitting signal.

If the noise shaper 318 is configured with gain factors [+2, −2, +1], it can meet the duplex requirements of the UMTS bands at 45 MHz, 80 MHz, 95 MHz and 190 MHz. This is accomplished by a noise-shaping characteristic with a complex valued zero in between the 95 MHz and 190 MHz duplex requirements. In such a case, the spurious emissions at all frequencies except the 400 MHz duplex requirements are no problem.

The reconfigurable third order noise shaper 318 as illustrated in FIG. 6 has gain factors [+2, −2, +1]. A bus ripper 610 rips off the 6 least significant bits from the 16-bit signal. Therefore, the output of the bus ripper 610 is the 6 least significant bits of the 16-bit input signal.

To obtain a 1st order noise shaper the 6 least significant bits are added back to the input 16-bit signal at block 604. The 6 least significant bits pass through a unit delay device 612 and an amplifier 614 having gain factor 2 before it is added to the input signal at block 604.

To obtain a 2nd order noise shaper another branch is added to the feedback loop with 2 unit delay blocks 612, 616, and an amplifier 618 with gain factor 2. This 6-bit signal with 2 unit delays is subtracted from the output of block 604 at subtraction block 606.

To get a 3rd order noise shaper another branch is added to the feedback loop with unit delay blocks 612, 618 and an amplifier 620 having unit gain. The 6-bit signal is then added to the output from block 606 at the adder 612.

A bus ripper 624 processes the signal and removes the least significant 6 bits from the 16-bit signal. The 10 most significant bits are the output of the bus ripper 624.

The 400 MHz duplex requirements of UMTS band IV can be met by reconfiguring the third order nose shaper with the gain factors [+1, +1, −1]. This generates a 1st order low pass noise shaping effect combined with a high pass noise shaping effect.

To implement a third order noise shaper with gain factors [+1, +1, −1], the gain of amplifiers 610, 612 and 616 can be changed from 2, 2, 1 respectively to 1, 1 and 1 respectively. In addition, the subtraction block 606 can be replaced by an adder block and the adder block 608 can be replaced by a subtraction block. It can be appreciated that any gain factors can be used in the reconfigurable noise shaper 318 for implementation in other mobile and wireless communication systems, according to the specifications of the systems.

Exemplary Methods

In the following methods, the order in which the methods are described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the methods can be implemented in any suitable hardware, software, firmware, or a combination thereof, without departing from the scope of the invention.

Figure 7:
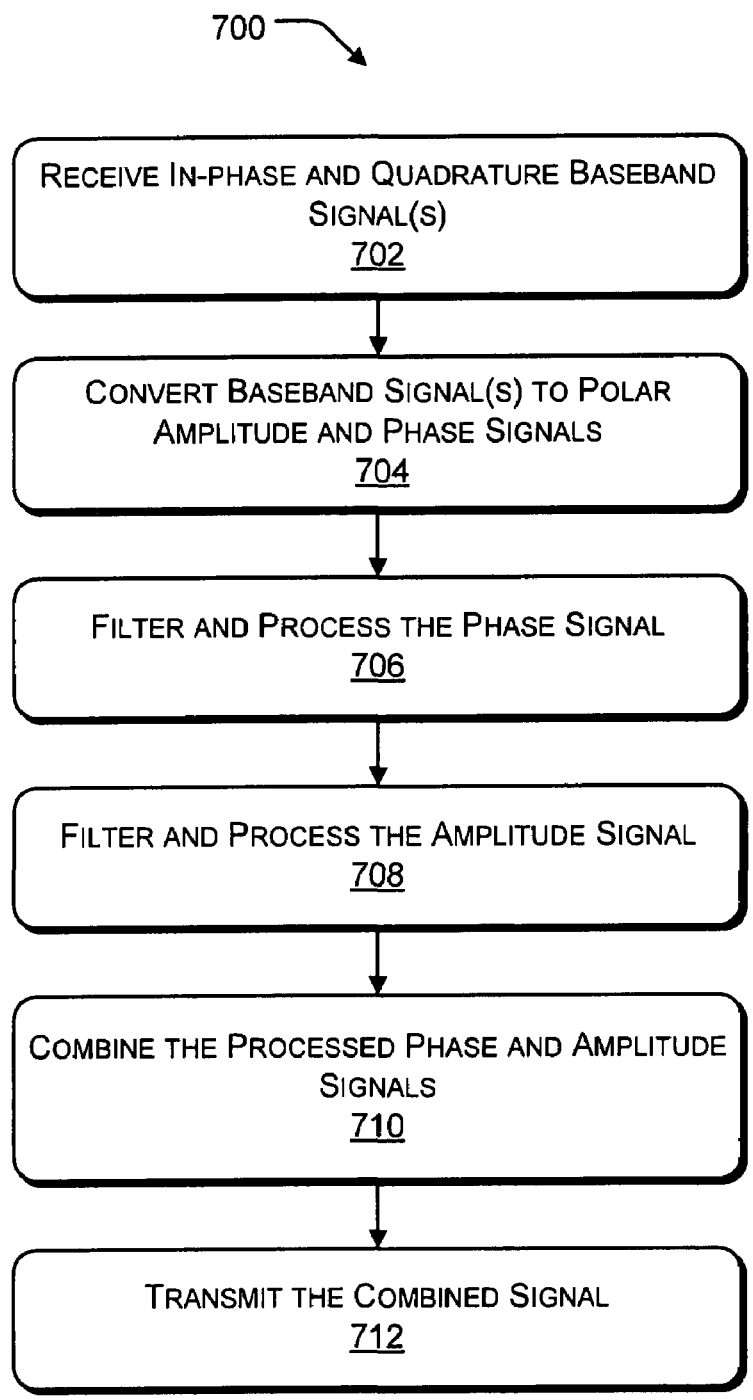
FIG. 7 is a flow chart illustrating an exemplary method for implementing polar modulation without analog filtering.

FIG. 7 illustrates an exemplary method for implementing polar modulation without analog filtering. At block 702, the polar modulator receives the baseband signal(s) from the source 202. The baseband signal(s) can be converted from analog into digital form before it reaches the polar modulator 206. In one implementation, the analog signal from the source 202 can be sampled and quantized before the signal is received by the digital polar modulator 206.

At block 704, the baseband signal (I and Q) can be converted from rectangular to polar amplitude and phase signals. The in-phase (I) and quadrature (Q) components of the baseband signal are converted into the phase signal 304 and amplitude signal 306 in the polar form. The R2P 302 may be used to implement this. In one implementation, a CORDIC (COordinate Rotational DIgital Computer) can be used to convert the in-phase and quadrature signals into the phase signal 304 and the amplitude signal 306.

At block 706, the phase signal 304 is filtered and processed. One or more digital filters 308 can be used to band limit and filter the signal. The phase signal 304 is then differentiated and passed through the PLL 312.

At block 708, the amplitude signal 306 is filtered and processed. One or more digital filters can band limit the signal. Then the amplitude signal 306 is up-sampled, the channel noise is removed along with the quantization noise and the amplitude signal 306 is finally converted to an analog signal.

At block 710, the processed phase signal from block 706 and the processed amplitude signal from block 708 are combined in the modulator 322.

At block 712, the combined signal drives the power amplifier (PA) 208. From the PA 208, the signal is send to the duplexer 210 and can be transmitted via the antenna 212. In one implementation, a non-linear power amplifier can be used in the saturated mode, close to the cut-off. This can increase the efficiency of the transmitter and can provide longer battery life as compared to a linear power amplifier.

Figure 8:
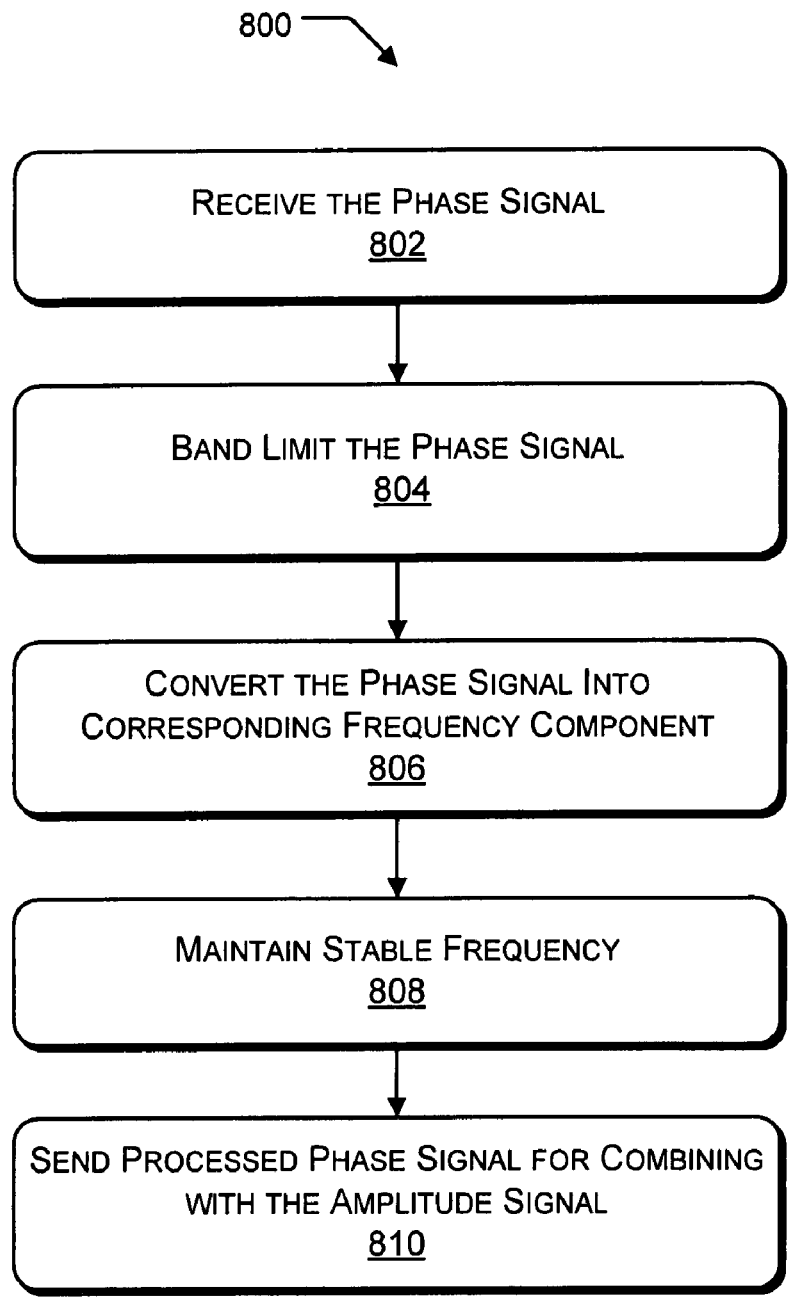
FIG. 8 is a flow chart illustrating an exemplary method for processing a phase signal in a polar modulator.

FIG. 8 illustrates the processing of the phase signal in the polar modulator. At block 802, the phase signal 304 can be derived from baseband in-phase signal I and quadrature signal Q. In an implementation, the R2P 302 converts the I and Q components of the baseband signal into amplitude 306 and phase signals 304 used in polar modulation.

At block 804, the phase signal 304 can be band limited to enable further processing. In an implementation, the phase signal is passed through a digital filter 308, which can be a low pass filter that band limits, the input phase signal 304. The digital filter 308 also removes high frequency noise from the phase signal 304. The high frequency noise is typically the quantization noise introduced when the analog signal is converted into a digital signal due to the finite resolution of the digital representation of the signal.

At block 806, the phase signal 304 can be converted to the corresponding frequency component. In an implementation, once the phase signal 304 is band limited and the quantization noise is removed, the phase signal 304 passes through the differentiator 310. The differentiator 310 generates an output signal that is proportional to the rate of change of the input signal. The rate of change of the phase is equal to the frequency. Therefore, if the phase signal 304 is the input to the differentiator 310, the phase signal 304 can be differentiated to generate a frequency signal, proportional to the input phase signal 304.

At block 808, the phase of the frequency signal obtained from the differentiator 310 can be maintained according to the phase information supplied at the input. In an implementation, a signal can be generated by the phase locked loop, PLL 312 that is locked to the phase of the input signal (the PLL changes frequency according to the phase signal input). Using PLL 312 phase-modulated transmit frequencies can be generated.

At block 810, the processed signal as obtained at block 808 can be send to the modulator 322. In an implementation, the processed phase signal and the processed amplitude signal can be combined together at the modulator 322 to obtain the modulated signal.

Figure 9:
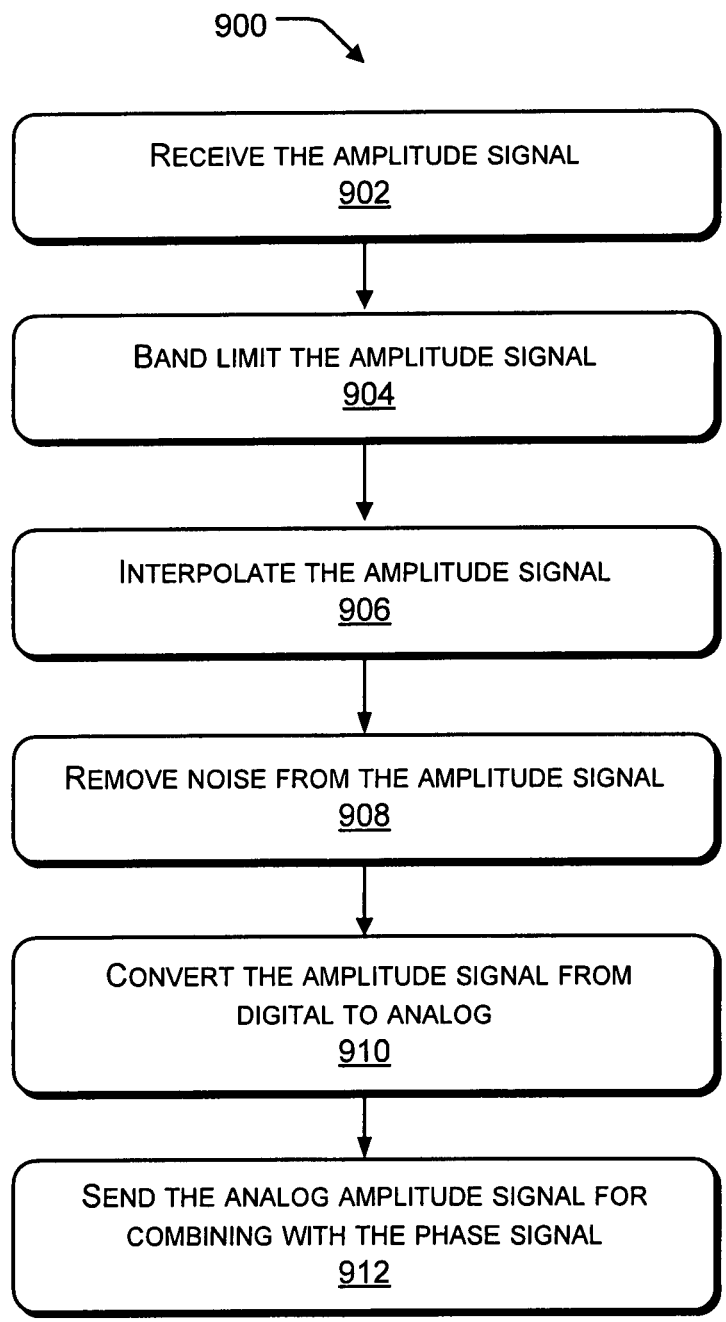
FIG. 9 is a flow chart illustrating an exemplary method for processing an amplitude signal in a polar modulator.

FIG. 9 illustrates processing of the amplitude signal 306 in the polar modulator 206. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method can be implemented in any suitable hardware, software, firmware, or a combination thereof, without departing from the scope of the invention.

At block 902, the amplitude signal of the polar signal can be derived from baseband I and Q signals. In one implementation, the R2P 302 converts the I and Q components of the baseband signal into amplitude 306 and phase signals 304 used in polar modulation.

At block 904, the amplitude signal 306 can be band limited to enable further processing. In an implementation, one or more digital filters 314 band limit the signal. The digital filter 314 can be a low pass filter that attenuates the high frequency signals. The digital filter 308 removes high frequency noise from the phase signal 304. The high frequency noise is typically the quantization noise introduced when the analog signal is converted into a digital signal due to the finite resolution of the digital representation of the signal.

At block 906, the amplitude signal 904 can be up-sampled by increasing the sampling rate of the amplitude signal 304. In an implementation, the output of the digital filter 314 is fed to the interpolator 316. Using interpolator 316, the sampling rate of the signal 306 can be increased by increasing the number of samples. The interpolator 316 improves the accuracy of the signal as the number of samples increase and that provides a better representation of the analog signal. Typically, the interpolators 316 are low pass filters. In an embodiment, the interpolator 316 can be a second order hold interpolator. For example, the input signal to the interpolator 316 can be 100 MHz and the output obtained at the output of the interpolator 316 can be 900 MHz.

At block 908, noise can be removed from the amplitude signal 306. In an implementation, the quantization noise can be shaped to some part of the spectrum where it does not violate the transmit spectrum mask by the noise shaper 318. The noise shaper 318 shapes the quantization noise by shifting the quantization noise in frequency. Noise shaping is a bit reduction technique used to minimize quantization error. Noise shaping can be used to reshape the frequency contour of the noise. For example, the input digital signal to the noise shaper 318 can be of 16-bit resolution and the digital signal obtained at the output of the noise shaper 318 can be of 10-12 bit resolution. The noise shaper 318 can utilize a low pass filter to reduce the quantization noise and improve the quality of the signal by improving the signal to noise ratio of the signal. In one implementation, the noise shaper 318 can be a reconfigurable third order noise shaper.

At block 910, the amplitude signal 306 can be converted from digital form to analog form. In an implementation, the improved quality amplitude signal 306 obtained from the noise shaper 318 can be converted into an analog signal before being combined with the phase signal by the DAC 320. In one implementation, a 10-12 bit fully segmented DAC can be used.

At block 912, the analog amplitude signal as obtained at block 910 can be combined with the processed phase signal. In an implementation, both the processed phase signal and the processed amplitude signal can be combined at the modulator 322. The output of the modulator 322 is the modulated signal.

Exemplary Device

Figure 10:
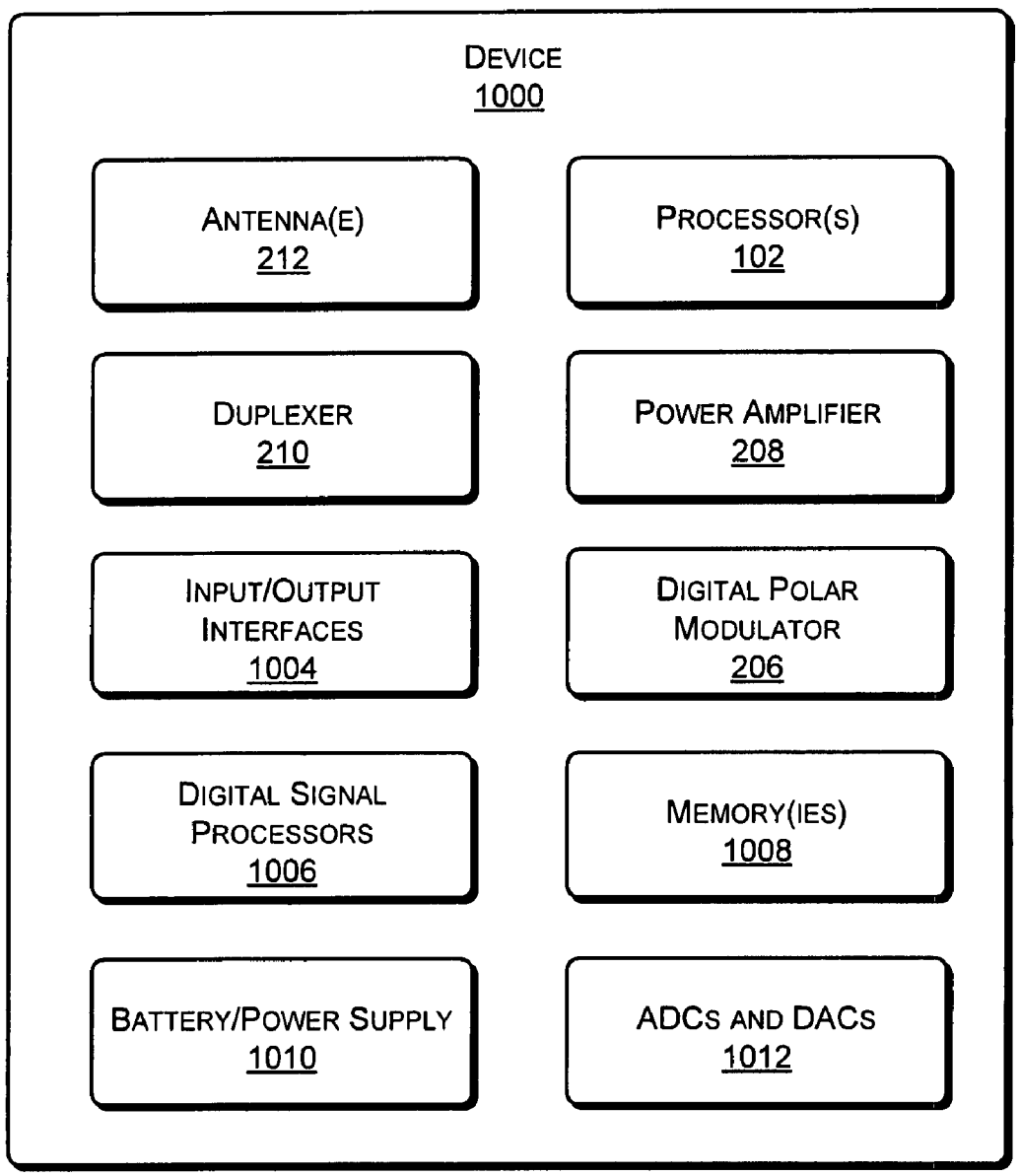
FIG. 10 is a block diagram illustrating an exemplary embodiment computing device implementing polar modulation without analog filtering.

FIG. 10 illustrates an embodiment of a device 1000 implementing polar modulation without analog filtering. In this example, the device 1000 is a mobile communication or computing device. The device 1000 includes one or more antennae 212 for transmitting and receiving radio frequency. The antennae 212 may be configured to received different radio frequencies (RF) in different bands. The antenna 212 can include smart antennas, fractal antennas, microstrip antenna and so on.

One or more processors 1002 perform control and command functions, including accessing and controlling the components of the mobile computing device 1000. Processor(s) 1002 can be a single processing unit or a number of units all of which could include multiple computing units.

One or more memories 1008 provide various storage functions, including storing executable instructions (e.g., an operating system). The memories 1008 can include read only memory, random access memory, flash memory, etc. The program instructions are stored in the memory 206 and are executed by the processor(s) 202.

The duplexer 210 receives and transmits the signals from and to the antennae 212. The duplexer 210 can include hybrid ring duplexer, cavity notch duplexer, band pass or band reject duplexer and so on. The power amplifier 208 increases the power efficiency of the signal to be transmitted from the mobile computing device 1000. Power amplifiers can include class B, AB, C power amplifiers.

The digital polar modulator 206 modulates the baseband signal for transmission. The output of the polar modulator is fed to the power amplifier 208.

Mobile computing device 1000 can further include input/output interfaces 1004 such as a microphone, a user screen, a user interface (e.g., keypad, touchpad, etc.), speakers, and so on. Digital signal processors 1006 include functions such as compressing, decompressing and shaping signals sent and received by the mobile computing device 1000. The mobile computing device 1000 also includes a battery or power supply 1010 that provides power to the mobile computing device.

Furthermore, the mobile computing device 1000 includes analog to digital converters (ADC) and digital to analog converters (DAC) are represented by ADCs and DACs 1012. An ADC is used to convert analog signals (such as received RF signals) to digital signals, while a DAC translates digital signals to analog signals.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the systems described could be configured as wireless communication devices, computing devices, and other electronic devices.

What is claimed is:

1. A polar modulator without an analog filter, comprising:
   an interpolator that upsamples and interpolates a digital amplitude signal;
   a noise shaper that reshapes a frequency contour of a quantization noise of the upsampled and interpolated digital amplitude signal, wherein the noise shaper has a first order behavior at DC and a second order behavior at an adjustable frequency offset;
   a digital-to-analog converter that converts the reshaped amplitude signal to an analog signal; and
   a modulator that combines a phase signal and the analog amplitude signal, and outputs a modulated signal.

2. The polar modulator of claim 1, wherein the interpolator performs quadratic interpolation while upsampling to a higher sampling rate.

3. The polar modulator of claim 1, wherein the noise shaper is adaptively adjusted in respect to a transmit frequency.

4. The polar modulator of claim 1 further comprising one or more digital filters to limit spectra of one of the following: the analog amplitude signal, the phase signal, or both.

5. The polar modulator of claim 1 further comprising a differentiator that differentiates the phase signal into a frequency signal proportional to the phase signal.

6. The polar modulator of claim 5 further comprising a phase lock loop that receives the frequency signal and generates a phase-modulated signal at a transmit frequency.

7. The polar modulator of claim 1 further comprising a digital gain control component that amplifies or attenuates the amplitude signal.

8. The polar modulator of claim 7, wherein digital gain control is applied before the noise shaper.

9. The polar modulator of claim 8, wherein digital gain control is applied before and after the interpolator.

10. A device implementing a polar modulator without an analog filter, comprising:
    a component that provides digital signals, wherein an input signal to the digital signals is either in polar coordinates or is being converted into a polar amplitude signal and a phase signal, and modulates the polar amplitude and the phase signal to a transmit signal; and
    a power amplifier that receives the transmit, wherein the polar modulator comprises a third order noise shaper that receives the amplitude signal at an increased sampling rate, and reshapes the frequency contour of the noise of the amplitude signal, and the noise shaping function has a first order behavior at DC and a second order behavior at an adjustable frequency offset.

11. The device of claim 10, wherein the polar modulator comprises one or more digital filters to process the phase signal and the amplitude signal.

12. The device of claim 10, wherein the polar modulator comprises a differentiator that differentiates the phase signal into a frequency signal proportional to the phase signal.

13. The device of claim 10, wherein the polar modulator comprises a second order hold interpolator that increases the sampling rate of the amplitude signal.

14. The device of claim 10, wherein the noise shaping function is adaptively adjusted in respect to the transmit frequency.

15. The device of claim 10, wherein the polar modulator comprises digital gain control.

16. The device of claim 15, wherein the digital gain control is placed before and after the interpolator.

17. The device of claim 10, wherein the component is one of the following: a baseband unit or an analog to digital converter.

18. A method of implementing polar modulation without an analog filter comprising:

upsampling and interpolating a digital amplitude signal;

reshaping a frequency contour of a quantization noise of the upsampled and interpolated digital amplitude signal, wherein the reshaping has a first order behavior at DC and a second order behavior at an adjustable frequency offset;

converting the reshaped amplitude signal to an analog signal;

combining a phase signal and the analog amplitude signal;

outputting a modulated signal.

19. The method of claim 18, wherein the upsampling performs quadratic interpolation while upsampling to a higher sampling rate.

20. The method of claim 18, wherein the reshaping is adaptively adjusted to a transmit frequency.

21. The method of claim 18 further comprising amplifying or attenuating the amplitude signal.

* * * * *